(12) United States Patent
Al-Shyoukh

(10) Patent No.: US 10,707,871 B1
(45) Date of Patent: Jul. 7, 2020

(54) CAPACITIVE LEVEL SHIFTER

(71) Applicant: Silicon Laboratories Inc., Austin, TX (US)

(72) Inventor: Mohammad Al-Shyoukh, Cedar Park, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/504,149

(22) Filed: Jul. 5, 2019

(51) Int. Cl.
*H03K 19/0185* (2006.01)
*H03K 3/356* (2006.01)
*H03K 19/00* (2006.01)

(52) U.S. Cl.
CPC ........... *H03K 19/018521* (2013.01); *H03K 3/356113* (2013.01); *H03K 19/0013* (2013.01)

(58) Field of Classification Search
CPC ........... H03K 19/0175; H03K 19/0185; H03K 19/018507; H03K 19/018514; H03K 19/018521
See application file for complete search history.

(56) References Cited

U.S. PATENT DOCUMENTS

| | | | | |
|---|---|---|---|---|
| 6,201,429 B1 * | 3/2001 | Rosenthal | ........... | H03K 19/0013 326/62 |
| 7,180,329 B1 * | 2/2007 | Sia | ........... | H03K 3/013 326/68 |
| 7,199,617 B1 * | 4/2007 | Schrom | ........... | H03K 19/018528 326/68 |
| 8,446,173 B1 * | 5/2013 | Faucher | ........... | H03K 19/00361 326/27 |
| 8,610,462 B1 * | 12/2013 | Wang | ........... | H03K 3/356113 326/68 |
| 8,847,661 B2 * | 9/2014 | Choung | ........... | H03K 3/01 326/62 |
| 9,225,330 B2 * | 12/2015 | Koudate | ........... | H03K 19/018521 |
| 9,331,679 B1 * | 5/2016 | Jain | ........... | H03K 3/356104 |
| 10,063,188 B2 | 8/2018 | Srinivas | | |
| 2005/0285658 A1 * | 12/2005 | Schulmeyer | ........... | H03K 25/02 327/333 |
| 2008/0042722 A1 * | 2/2008 | Dornbusch | ........... | H03K 19/018514 327/333 |
| 2017/0237438 A1 * | 8/2017 | Terletzki | ........... | H03K 19/018521 326/81 |

OTHER PUBLICATIONS

Abdelmoaty, A., et al., "A High-Voltage Level Shifter with Sub-Nano-Second Propagation Delay for Switching Power Converters," IEEE Applied Power Electronics Conference and Exposition (APEC), 2016, pp. 2437-2440.

* cited by examiner

*Primary Examiner* — Jason Crawford
(74) *Attorney, Agent, or Firm* — Zagorin Cave LLP

(57) ABSTRACT

A level shifter includes a flying capacitor having a first plate and a second plate. The level shifter includes a circuit coupled to the first plate and coupled to the second plate. The circuit is configured to receive a received signal having a logic state using a first voltage domain and configured to generate a symmetrical output signal having the logic state using a second voltage domain based on charge stored by the flying capacitor. The level shifter has a propagation delay from the received signal to the symmetrical output signal of less than one nanosecond with negligible duty cycle distortion.

20 Claims, 1 Drawing Sheet

US 10,707,871 B1

CAPACITIVE LEVEL SHIFTER

BACKGROUND

Field of the Invention

The invention relates to integrated circuits and more particularly to circuits for converting signals from one voltage domain to another voltage domain.

Description of the Related Art

In general, a level shifter is a circuit that translates signals from one voltage domain to another voltage domain to provide compatibility between integrated circuits having different voltage requirements. For example, a conventional level shifter converts signals of a low power application (e.g., a processor operating with a power supply voltage of 1.8 V) to signals of a high power domain (e.g., analog input/output circuits operating at 2.25 V-5.5 V).

FIG. 1 illustrates a circuit diagram of a conventional level shifter. Circuit 310 of conventional level shifter 100 includes two low-voltage inverters implemented using low-voltage transistors and powered by low-voltage power supply voltage $V_{DD}$ to drive the gate of high-voltage n-type transistors 306 and 308. High-voltage n-type transistors 306 and 308 control cross-coupled high-voltage p-type transistors 302 and 304. A transition of input signal IN from a logic '0' to logic '1' causes the gate of transistor 308 to transition to approximately low-voltage power supply voltage $V_{DD}$, causing the gate of transistor 302 to transition to approximately 0 V and pulling the gate of transistor 304 to high-voltage power supply voltage $V_{CC}$, which turns off transistor 304. Output signal OUT is an inverted version of the signal on node 312. Thus, output signal OUT transitions to approximately high-voltage power supply voltage $V_{CC}$. That is, a logic '1' signal on input node IN in the first voltage domain (e.g., low-voltage power supply voltage $V_{DD}$) results in a logic '1' signal on output node OUT in the second voltage domain (e.g., high-voltage power supply voltage $V_{CC}$). A transition of input signal IN from a logic '1' to logic '0' causes the voltage on the gate of transistor 306 to transition to approximately low-voltage power supply voltage $V_{DD}$, causing the voltage on the gate of transistor 304 to transition to approximately 0 V and in the process, charges the gate of transistor 302 to approximately high-voltage power supply voltage $V_{CC}$. Thus, output signal OUT transitions to approximately 0 V.

The propagation delay of conventional level shifter 100 is relatively slow (e.g., several nanoseconds in a target manufacturing technology) and is asymmetrical. For example, a transition of output signal OUT from logic '0' to logic '1' has a lesser propagation delay than the transition of output signal OUT from logic '1' to logic '0.' Asymmetrical propagation delay results in duty cycle distortion that can degrade performance of a target application. Accordingly, improved techniques for level shifting a signal are desired.

SUMMARY OF EMBODIMENTS OF THE INVENTION

In at least one embodiment of the invention, a capacitive level shifter includes a first power supply node, a second power supply node, a third power supply node, an input node, an output node, and an input circuit coupled between the second power supply node and the third power supply node. The input circuit includes complementary versions of the input node. The level shifter includes a differential amplifier coupled between a differential pair of nodes, the third power supply node, and the complementary versions of the input node. The level shifter includes a load circuit coupled between the first power supply node and the differential pair of nodes. The level shifter includes a capacitor having a first plate and a second plate. The first plate is coupled to a first node of the differential pair of nodes and the second plate is coupled to a second node of the complementary versions of the input node. The level shifter includes an output circuit coupled between the first power supply node and the third power supply node and is configured to generate an output signal on the output node based on a first voltage on the first plate and a second voltage on the second plate.

In at least one embodiment of the invention, a method for level-shifting a received signal from a first voltage domain to a second voltage domain includes establishing a charge across a capacitor based on a logic level of an input signal received by a circuit in the first voltage domain. The method includes maintaining the charge across the capacitor based on the logic level using a second circuit in the second voltage domain. The method includes generating an output signal in the second voltage domain based on the logic level using the charge across the capacitor.

In at least one embodiment of the invention, a level shifter includes a flying capacitor having a first plate and a second plate. The level shifter includes a circuit coupled to the first plate and coupled to the second plate. The circuit is configured to receive a received signal having a logic state using a first voltage domain and configured to generate a symmetrical output signal having the logic state using a second voltage domain based on charge stored by the flying capacitor. The level shifter has a propagation delay from the received signal to the symmetrical output signal of less than one nanosecond with negligible duty cycle distortion.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
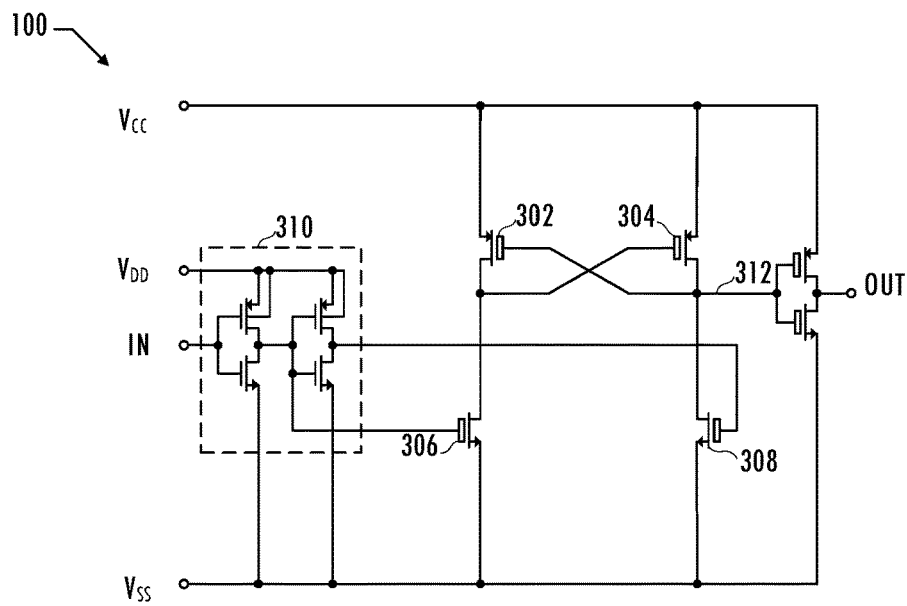
FIG. 1 illustrates a circuit diagram of a conventional level shifter of an integrated circuit.
Figure 2:
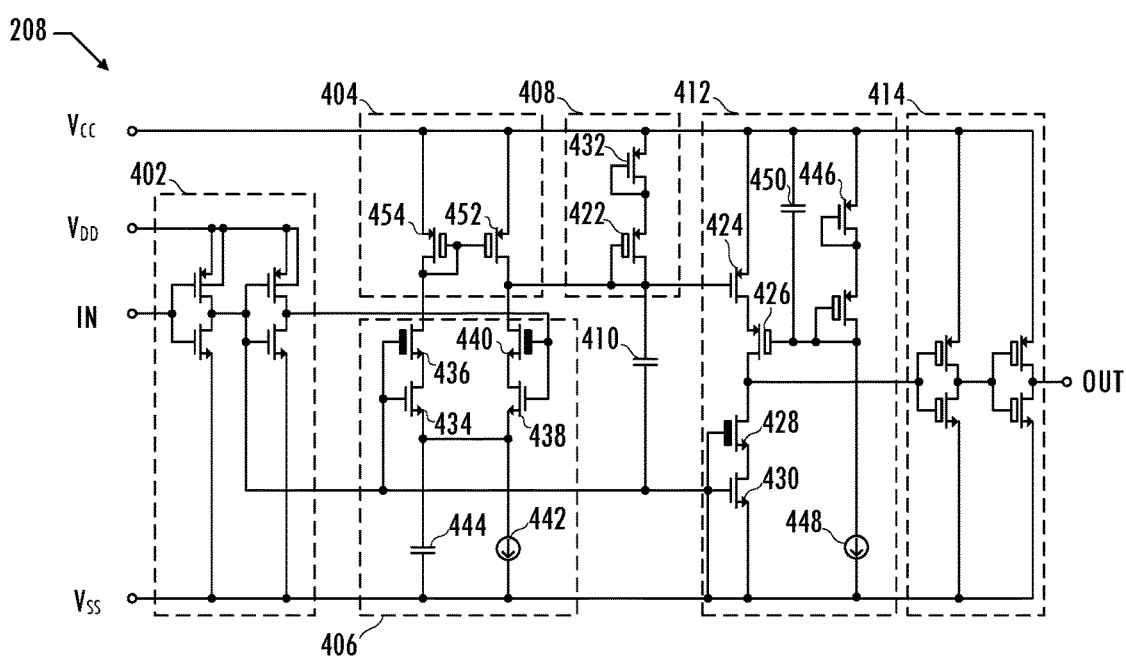
FIG. 2 illustrates a circuit diagram of an exemplary capacitive level shifter of an integrated circuit consistent with at least one embodiment of the invention.

A capacitive level shifter that generates a symmetrical output signal with lesser propagation delay than a conventional level shifter is described. FIG. 2 illustrates an exemplary circuit diagram of an exemplary, capacitive level shifter consistent with at least one embodiment of the isolator product. Capacitive level shifter 208 converts input signal IN received from a low voltage domain circuit (e.g., a circuit configured to receive a low-voltage power supply voltage $V_{DD}$ that is generated by a subregulator) to a high voltage domain circuit (e.g., a circuit configured to receive a high-voltage power supply voltage $V_{CC}$). Capacitive level shifter 208 includes flying capacitor 410. As referred to herein, a flying capacitor is a capacitor that floats with respect to ground. Both plates of a flying capacitor change potential relative to ground. In at least one embodiment, flying capacitor 410 is a metal-oxide-metal (MoM) capacitor or a parallel plate capacitor (e.g., metal-insulator-metal (MiM) capacitor or a poly-poly capacitor) and has a capacitance value in the range of 100 femto-Farads (fF) to 1 pico-Farad (pF). Flying capacitor 410 is the main vehicle for transmitting a logic state from one power domain to another power domain relatively quickly (e.g., in 2 ns or less as compared to 4-20 nanoseconds of a conventional level shifter). However, a flying capacitor may lose its charge over time (e.g., due to leakage currents). Capacitive level shifter 208 includes a mechanism for maintaining charge on plates of flying capacitor 410 for indefinitely long logic states to ensure that charge across flying capacitor 410 is consistent with the logic state of input signal IN. In at least one embodiment, capacitive level shifter 208 translates input signal IN from the low voltage domain to a standard or high voltage domain with sub-nanosecond propagation delays and low or negligible duty cycle distortion.

In at least one embodiment of capacitive level shifter 208, a micro-power circuit maintains charge on flying capacitor 410 even for indefinitely long logic states. The micro-power circuit includes input buffers 402, differential amplifier 406, diode-mirrored load 404, and clamp 408. Input buffers 402 receive input signal IN using low-voltage transistors configured as inverters in the low voltage domain. Input buffers 402 includes complementary nodes configured to receive complementary buffered versions of input signal IN. Differential amplifier 406 includes transistor 434, which is a low-voltage transistor, and transistor 436, which is a high-voltage native transistor (as indicated by the transistor symbol with the filled, rectangular gate), that are configured as a high-voltage enhancement-like device with relatively low threshold voltage $V_{tn}$ and sufficient current drive. Similarly, transistor 438 is a low-voltage transistor and transistor 440 is a high-voltage native transistor and transistors 438 and 440 are configured as a high-voltage enhancement-like device with relatively low threshold voltage $V_{tn}$ and sufficient current drive. Transistors 434 and 436 and transistors 438 and 440 form two halves of a differential pair of transistors that are configured to steer tail current into transistors 434 and 436 when input signal IN is logic '0' (i.e., has a low voltage, e.g., approximately 0 V) and steer tail current into transistors 438 and 440 when input signal IN is logic '1' (i.e., has a high voltage, e.g., approximately $V_{DD}$). Capacitor 444, which in some embodiments is a metal-oxide semiconductor capacitor (e.g., native n-type capacitor) having a value in the range of 50 fF to 200 fF, increases the speed of the current steering from one half of the differential stage 406 to the other half of differential amplifier 406. Unlike a conventional differential pair of transistors, the configuration of the high-voltage native transistor with the low-voltage transistor in each half of differential amplifier 406 causes the entire current to flow in a branch of differential amplifier 406.

Note that transistors 428, 436, and 440 are illustrated as being high-voltage native transistors and have a threshold voltage of approximately 0 V, which can be less than 0 V in some corners of the semiconductor manufacturing process. In an exemplary integrated circuit manufacturing process, a native transistor is a type of transistor that is between an enhancement mode transistor (i.e., a transistor that is off at a zero gate-to-source voltage) and a depletion mode transistor (i.e., a transistor that is on at a zero gate-to-source voltage). The native transistor has a threshold voltage of approximately 0 V. The native transistor may be an undoped transistor having a first conductivity type (e.g., n-type) manufactured directly in a substrate having a second conductivity type (e.g., p-type), whereas standard transistors are manufactured in a doped well that is formed in a substrate. The manufacturing process may provide transistors having different breakdown voltages and speeds of operation as a result of gate terminals formed using oxide layers of different thicknesses. An exemplary high-voltage transistor has a thicker gate oxide and therefore has a higher breakdown voltage but is slower than a low-voltage transistor that has a thinner gate oxide thickness.

A native transistor may be manufactured with oxide having a thin-gate oxide thickness (i.e., low-voltage native transistor) or a thick-gate oxide thickness (i.e., high-voltage native transistor). The native transistor is typically larger than a standard transistor (e.g., the native transistor may have a minimum length that is three to six times the minimum length of a standard transistor (high-voltage or low-voltage) having the same oxide thickness), and typically has a lower transconductance than a standard transistor. The low-voltage native transistor and the high-voltage native transistor have threshold voltages with magnitudes less than a threshold voltage of a standard transistor. In general, a native transistor has a threshold voltage of approximately 0 V. The threshold voltage of the low-voltage transistor has a magnitude less than the threshold voltage of a high-voltage transistor. The high-voltage native transistor has a threshold voltage with a magnitude less than a threshold voltage of a high-voltage transistor. In an exemplary integrated circuit manufacturing process, the threshold voltage of the low-voltage transistor is at least 200 mV less than the threshold voltage of the high-voltage transistor (e.g., the threshold voltage of the low-voltage transistor is approximately 350-400 mV and the threshold voltage of the high-voltage transistor is approximately 600-850 mV).

Push-pull circuit 412 includes transistors 424 and 446, current source 448, and capacitor 450 that generate a gate bias for transistor 426. In at least one embodiment, capacitor 450 is a metal-oxide semiconductor capacitor (e.g., p-type) and transistors 424 and 446, current source 448, and capacitor 450 are designed to maximize the magnitude of the drain-to-source voltage of transistor 424 while remaining within the reliability limits of transistor 424, which is a low-voltage transistor, thus increasing the drive strength of the push-up, high side path of push-pull circuit 412.

Push-pull circuit 412 includes transistors 424 and 426 that are cascaded to form a high-side transistor (i.e. a push-up to high-voltage power supply voltage $V_{CC}$). Transistor 426 is a high-voltage transistor (as indicated by the unfilled rectangular gate) and transistor 424 is a low-voltage transistor. Transistors 428 and 430 form a cascaded low-side transistor using a high-voltage, native n-type transistor (as indicated by the filled rectangular gate) in series with a low-voltage enhancement mode transistor. The composite device behaves like an enhancement mode transistor with relatively low threshold voltage and substantial current drive. Inverters 414 are formed from high-voltage transistors and buffer the output of the push-pull stage.

Flying capacitor 410 shifts the logic information from the low voltage domain to the high voltage domain. Unlike a conventional current mirror, which configures a transistor to operate in the saturation region of transistor operation, transistor 452 of diode-mirrored load 404 is configured to operate in a linear region of transistor operation. When diode-mirrored load 404 is active (e.g., tail current 442 is steered through transistors 434 and 436 and then mirrored via transistor 454, transistor 452 ensures that the top plate of flying capacitor 410 remains charged to high-voltage power supply voltage $V_{CC}$. Transistor 452 operates as a resistive path ensuring the top plate of flying capacitor 410 remains charged to high-voltage power supply voltage $V_{CC}$. The drain-to-source voltage of transistor 452 is close to zero Volts, thus transistor 452 operates in the linear region of transistor operation. When current is steered into transistors 438 and 440, diode mirrored load 404 dis-engages and tail current 442 conducts through clamp circuit 408, which clamps the top plate of capacitor 410 to $[V_{CC}-|V_{GS,\ LV,\ 432}|-|V_{GS,\ HV,\ 422}|$ while the bottom plate is discharged to 0 V and engages the high side path (i.e., the push up path of push-pull circuit 412 coupled to the high voltage domain). When current is steered into transistors 434 and 436, diode mirrored load 404 engages and charges the top plate of flying capacitor 410 to high-voltage power supply voltage $V_{CC}$ while the bottom plate of flying capacitor 410 is discharged to low-voltage power supply voltage $V_{DD}$, thereby engaging the low side path (i.e., the pull down path of push-pull circuit 412 coupled to the low voltage domain).

Flying capacitor 410 remains pre-charged with a first plate coupled to the high voltage domain and a second plate coupled to the low voltage domain, i.e., $[V_{HVplate}, V_{LVplate}]$ at either:

$[V_{CC}-|V_{GS,\ LV,\ 432}|-|V_{GS,\ HV,\ 422}|,\ 0\ V]$, where $V_{GS,\ LV,\ 432}$ is the gate-to-source voltage of transistor 432, which is a low-voltage transistor, $V_{GS,\ HV,\ 422}$ is the gate-to-source voltage of transistor 422, which is a high-voltage transistor (as indicated by the transistor symbol with the unfilled, rectangular gate), and where the high side path is on and the low side path is off; or $[V_{CC}, V_{DD}]$, where the high side path is off and the low side path is on. In at least one embodiment of capacitive level shifter 208, $|V_{GS,\ LV,\ 432}|+|V_{GS,\ HV,\ 422}|$ is selected by design to be approximately equal to low-voltage power supply voltage $V_{DD}$.

Thus, a capacitive level shifter has been described that realizes fast propagation delay (e.g., less than 2 ns) and negligible duty cycle distortion. In some embodiments, capacitive level shifter 208 has a propagation delay from input signal IN to output signal OUT, of less than one nanosecond with negligible duty cycle distortion (i.e., output signal OUT is symmetrical). The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A capacitive level shifter comprising:
   a first power supply node;
   a second power supply node;
   a third power supply node;
   an input node;
   an output node;
   an input circuit coupled between the second power supply node and the third power supply node and including complementary versions of the input node;
   a differential amplifier coupled between a differential pair of nodes, the third power supply node, and the complementary versions of the input node;
   a load circuit coupled between the first power supply node and the differential pair of nodes;
   a capacitor having a first plate and a second plate, wherein the first plate is coupled to a first node of the differential pair of nodes and the second plate is coupled to a second node of the complementary versions of the input node; and
   an output circuit coupled between the first power supply node and the third power supply node and configured to generate an output signal on the output node based on a first voltage on the first plate and a second voltage on the second plate.

2. The capacitive level shifter, as recited in claim 1, wherein the differential amplifier comprises:
   a first terminal coupled to a first low-voltage transistor and a first native, high-voltage transistor coupled in series with the first low-voltage transistor; and
   a second terminal coupled to a second low-voltage transistor and a second native, high-voltage transistor coupled in series with the second low-voltage transistor,
   wherein the first terminal is coupled to the second node of the complementary versions of the input node and the second terminal is coupled to a third node of the complementary versions of the input node.

3. The capacitive level shifter, as recited in claim 1, further comprising:
   a clamp circuit coupled between the first power supply node and the first plate of the capacitor.

4. The capacitive level shifter, as recited in claim 3, wherein the clamp circuit comprises:
   a first low-voltage transistor configured as a diode and coupled between the first power supply node and an intermediate node; and
   a first high-voltage transistor diode-coupled in series with the first low-voltage transistor and coupled between the intermediate node and the first plate of the capacitor.

5. The capacitive level shifter, as recited in claim 1, wherein the load circuit comprises:
   a first high-voltage transistor coupled between the first power supply node and a first branch of the differential amplifier; and
   a second high-voltage transistor coupled between the first power supply node and a second branch of the differential amplifier,
   wherein gate terminals of the first high-voltage transistor and the second high-voltage transistor are coupled to the first branch of the differential amplifier.

6. The capacitive level shifter, as recited in claim 1, wherein the output circuit comprises:
   a push-pull circuit coupled between the first power supply node and the third power supply node; and
   an output driver coupled in series with the push-pull circuit and between the first power supply node and the third power supply node.

7. The capacitive level shifter, as recited in claim 6, wherein the push-pull circuit comprises low-voltage transistors, high-voltage transistors, and a native, high-voltage transistor.

8. The capacitive level shifter, as recited in claim 6, wherein the output circuit comprises high-voltage transistors and the input circuit comprises low-voltage transistors, and wherein the first power supply node is configured to receive a first power supply voltage level above ground and the second power supply node is configured to receive a second power supply voltage level above ground, the first power supply voltage level being greater than the second power supply voltage level.

9. The capacitive level shifter, as recited in claim 1, wherein the output signal is symmetrical.

10. The capacitive level shifter, as recited in claim 1, wherein a propagation delay from the input node to the output node is less than one nanosecond with negligible duty cycle distortion.

11. A method for level-shifting a received signal from a first voltage domain to a second voltage domain, the method comprising:
  establishing charge on plates of a capacitor consistent with a logic level of an input signal received by a circuit in the first voltage domain;
  maintaining the charge on the plates of the capacitor consistent with the logic level using a second circuit in the second voltage domain; and
  generating an output signal in the second voltage domain according to the logic level using the charge on the plates of the capacitor.

12. The method, as recited in claim 11, wherein maintaining the charge comprises steering current through a first half of a differential pair of transistors according to the logic level.

13. The method, as recited in claim 12, wherein the steering of the current replenishes a first charge on a first plate of the capacitor in response to a first logic level of the input signal.

14. The method, as recited in claim 11, further comprising:
  clamping a first voltage level on a first plate of the capacitor to a first power supply voltage level by delivering charge to a first power supply node in response to the first voltage level on the first plate exceeding the first power supply voltage level.

15. The method, as recited in claim 11, wherein steering current discharges a first plate of the capacitor in response to a second logic level of the input signal.

16. The method, as recited in claim 11, further comprising:
  generating complementary versions of the input signal using the first voltage domain.

17. The method, as recited in claim 11, further comprising:
  amplifying a first voltage on a first plate of the capacitor and a second voltage on a second plate of the capacitor to generate a signal in the second voltage domain; and
  buffering the signal in the second voltage domain to generate the output signal.

18. The method, as recited in claim 11, wherein the first voltage domain has a first power supply voltage level above ground and the second voltage domain has a second power supply voltage level above ground, the second power supply voltage level being greater than the first power supply voltage level.

19. The method, as recited in claim 11, wherein a propagation delay between the input signal and the output signal is less than one nanosecond with negligible duty cycle distortion.

20. A level shifter comprising:
  a flying capacitor having a first plate and a second plate; and
  a circuit coupled to the first plate and coupled to the second plate, the circuit being configured to receive a received signal having a logic state using a first voltage domain and configured to generate a symmetrical output signal having the logic state using a second voltage domain based on charge stored by the flying capacitor,
  wherein the level shifter has a propagation delay from the received signal to the symmetrical output signal of less than one nanosecond with negligible duty cycle distortion.

* * * * *